(12) United States Patent
Tiso et al.

(10) Patent No.: US 8,861,206 B2
(45) Date of Patent: Oct. 14, 2014

(54) CASING FOR ELECTRONIC BALLAST

(75) Inventors: Michele Tiso, Glonn (DE); Rene Twardzik, Traunreut (DE); Fubing Xie, Guangzhou (CN)

(73) Assignee: Osram Gesellschaft mit beschraenkter Haftung, Munich (DE)

( * ) Notice: Subject to any disclaimer, the term of this patent is extended or adjusted under 35 U.S.C. 154(b) by 323 days.

(21) Appl. No.: 13/256,226

(22) PCT Filed: Feb. 19, 2010

(86) PCT No.: PCT/EP2010/052131
§ 371 (c)(1),
(2), (4) Date: Sep. 13, 2011

(87) PCT Pub. No.: WO2010/102894
PCT Pub. Date: Sep. 16, 2010

(65) Prior Publication Data
US 2012/0002384 A1 Jan. 5, 2012

(30) Foreign Application Priority Data

Mar. 13, 2009 (CN) .......................... 2009 1 0127145

(51) Int. Cl.
*H05K 5/00* (2006.01)
(52) U.S. Cl.
USPC ........................................................ 361/752
(58) Field of Classification Search
USPC ........................................................ 361/752
See application file for complete search history.

(56) References Cited

U.S. PATENT DOCUMENTS

| | | | | |
|---|---|---|---|---|
| 4,226,491 A * | 10/1980 | Kazama et al. | ............... | 439/76.1 |
| 5,099,391 A * | 3/1992 | Maggelet et al. | ............. | 361/736 |
| 5,691,878 A | 11/1997 | Ahn et al. | | |
| 6,301,096 B1 | 10/2001 | Wozniczka | | |
| 6,366,022 B1 * | 4/2002 | Mies et al. | ....................... | 315/56 |
| 6,429,295 B1 | 8/2002 | Carr Pérez et al. | | |
| 8,582,315 B2 * | 11/2013 | Nishiyama | .................... | 361/807 |

FOREIGN PATENT DOCUMENTS

| | | |
|---|---|---|
| CN | 1256696 C | 1/2005 |
| CN | 201171241 Y | 12/2008 |
| EP | 0481409 A1 | 4/1992 |
| JP | 2005-183322 A | 7/2005 |
| WO | 0076283 A1 | 12/2000 |
| WO | 2009095308 A1 | 8/2009 |

OTHER PUBLICATIONS

English abstract of JP2005-183322A, dated Jul. 7, 2005.

* cited by examiner

*Primary Examiner* — Forrest M Phillips

(57) ABSTRACT

A casing for electronic ballast, in which a PCB assembly is received, may include: a top wall; a bottom wall opposite to the top wall; two opposite side walls extending integrally between the top wall and bottom wall; and two opposite end walls extending integrally from the top wall, wherein the top wall, bottom wall, side walls and end walls are formed integrally, the top wall, bottom wall and side walls define openings at both ends of the casing in a lengthwise direction of the casing, the end walls are arranged to be pivotable relative to the top wall so as to close the openings formed by the top wall, bottom wall and side walls.

15 Claims, 2 Drawing Sheets

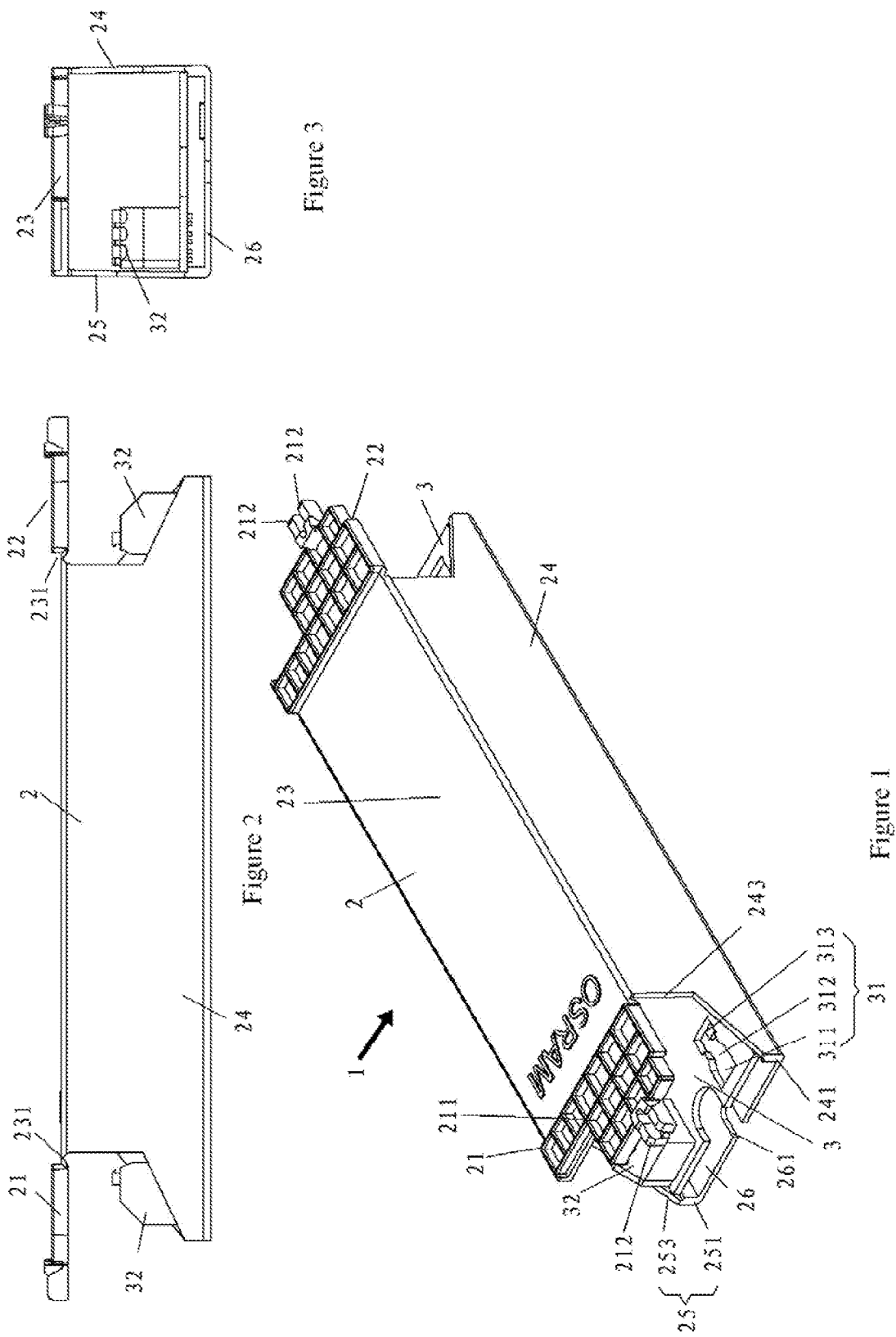

CASING FOR ELECTRONIC BALLAST

RELATED APPLICATIONS

The present application is a national stage entry according to 35 U.S.C. §371 of PCT application No.: PCT/EP2010/052131 filed on Feb. 19, 2010, which claims priority from Chinese application No.: 200910127145.7 filed on Mar. 13, 2009.

FIELD OF INVENTION

The invention relates to an electronic ballast, in particular, to a one-piece low cost casing for electronic ballast. Further, the invention relates to an electronic ballast assembly and a method of assembling the same.

BACKGROUND ART

An electronic ballast is a commonly used electronic component and is widely used in the illumination field. A whole electronic ballast comprises an input rectifier module, a power factor calibrating module and a DC/AC inverter. Thus, an electronic ballast must be packed into suitable sizes to enable the use of conventional electronic ballast in household.

Chinese Utility Model No. 01256696.9 discloses a casing for electronic ballast adapted to be used in outdoors illumination devices. The middle of the case for electronic ballast is designed to be a hollow metal casing. The both ends of the casing are designed to be socket-connected with a polymer casing made with a mould. The polymer casing fits the caliber of the metal casing and is provided with a plurality of wire holes at the outside depending on the number of wires.

However, most of the currently used electronic ballast are of a two-piece or multi-piece casing configuration which comprises several mechanical components. These mechanical components comprises a base portion, a lid portion, a screw or support, an insulation plate (in case that the casing is made of metal material), and a filling portion which forms part of the overall mechanical structure and serves to hold the PCB in place inside the casing. Nevertheless, the casing for electronic ballast from prior art is assembled by a plurality of components and is structurally complicated as well as costly in manufacturing. Thus, it takes too much time to assemble the casing and electronic components, thereby further increasing the cost of the overall product.

SUMMARY OF THE INVENTION

Therefore, based on the above problems, it is provided a one-piece casing for electronic ballast which is structurally simple and lower in cost. The casing receives a PCB assembly therein and comprises: a top wall; a bottom wall opposite to the top wall; two opposite side walls extending integrally between the top wall and bottom wall; and two opposite end walls extending integrally from the top wall, wherein the top wall, bottom wall, side walls and end walls are formed integrally, the top wall, bottom wall and side walls define an opening at both ends of the casing in the lengthwise direction, the end walls are arranged to be pivotable relative to the top wall, thereby closing the opening formed by the top wall, bottom wall and side walls.

In one aspect of the invention, it is provided an electronic ballast assembly comprising a PCB assembly and a casing for receiving the PCB assembly. The PCB assembly comprises a plate-shaped plate body and a first holding portion disposed at opposite ends of the plate body. The casing comprises a top wall; a bottom wall opposite to the top wall; two opposite side walls extending integrally between the top wall and bottom wall; and two opposite end walls extending integrally from the top wall, wherein the top wall, bottom wall, side walls and end walls are formed integrally, the top wall, bottom wall and side walls define an opening at both ends of the casing in the lengthwise direction, the end walls are arranged to be pivotable relative to the top wall, thereby closing the opening formed by the top wall, bottom wall and side walls, and wherein the inner surface of the side walls is provided with a support portion for supporting the plate body of the PCB assembly, the end wall comprises a body extending from the top wall and a second holding portion disposed at the body, the first holding portion and the second holding portion fit with each other to enable the positioning of PCB assembly inside the casing.

In another aspect of the invention, it is provided a method of assembling a electronic ballast assembly, comprising: inserting PCBA assembly into a casing and supporting the PCBA assembly on a supporting portion; pivoting a end wall to engage a second holding portion on the end wall with a first holding portion on the PCBA assembly, thereby installing and positioning the PCBA assembly inside the casing.

With the one-piece configuration of the casing for a electronic ballast according to the invention, the assembling and holding of a electronic ballast assembly can be realized simply by snap-fitting compared with conventional two-piece or multi-piece casing configuration, thereby simplifying the assembly and lowering the cost.

BRIEF DESCRIPTION OF THE DRAWINGS

The invention will be better understood from the detailed description of the preferred and non-limiting embodiments of the invention with reference to the drawings, in which:

FIG. 1 is a perspective view of a electronic ballast assembly according to the invention, wherein the PCB assembly is assembled inside the casing for electronic ballast and the end wall is in an open state;

FIG. 2 is a side view of the electronic ballast assembly shown in FIG. 1 seen from the side wall side, wherein the pivoting direction of the end wall at the time of closing the casing for electronic ballast is shown;

FIG. 3 is an end view of the electronic ballast assembly shown in FIG. 1 seen from the end wall side;

DETAILED DESCRIPTION OF EMBODIMENTS

Figure 5:
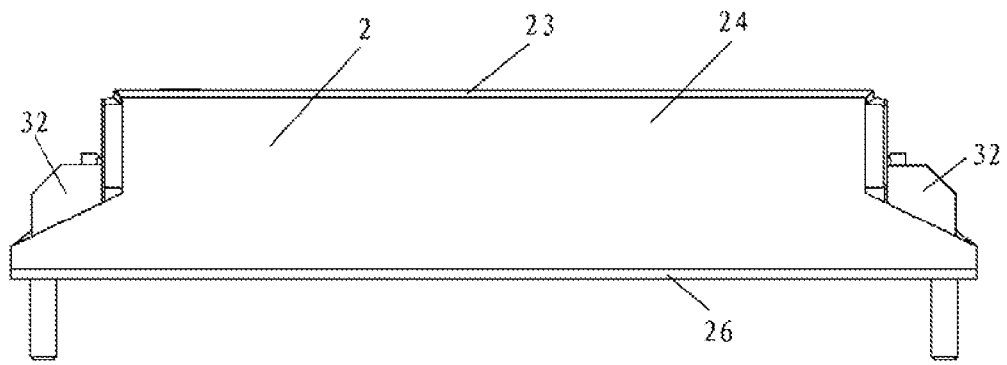
FIG. 5 is a side view of the electronic ballast assembly shown in FIG. 4 seen from the side wall side.

As shown in FIG. 1, an electronic ballast assembly according to an embodiment of the invention is designated at 1 in its entirety. The electronic ballast assembly 1 comprises a PCB assembly 3 and a casing 2 for receiving the PCB assembly 3.

With reference to FIG. 1, in the illustrated embodiment, the PCB assembly 3 comprises a plate-shaped plate body 33, a terminal 32 disposed at the opposite ends of the plate body 33 for wire connecting and disconnecting, and a first holding portion disposed at the opposite ends of the plate body 33 for enabling the positioning of the PCB assembly 3 inside the casing 2. In the present embodiment, the first holding portion is a notch 31 composed of a first notch portion 311, a second notch portion 312 and a third notch portion 313 that are sequentially disposed in the lengthwise direction of the PCB assembly 3 near the end of the PCB assembly 3, wherein the width of the first notch portion 311 and the width of the third notch portion 313 in the width direction of the PCB assembly 3 are both larger than that of the second notch portion 312. Preferably, a beveling transition portion is arranged between the first notch portion 311 and the second notch portion 312 of the notch 31 for facilitating snap fitting.

With reference to FIGS. 1-3, casing 2 is of a substantially rectangular overall configuration that is formed by a top wall 23, a bottom wall 26 opposite to the top wall 23, two opposite side walls 24 and 25 extending integrally between the top wall 23 and bottom wall 26, and two opposite end walls 21 and 22 extending integrally from the top wall 23, wherein the end walls 21 and 22, the top wall 23, the bottom wall 26 and side walls 24 and 25 are formed integrally through, for example, injection molding, so that the casing 2 is of one-piece configuration. The top wall 23, the opposite bottom wall 26 and opposite side walls 24 and 25 extending between the top wall 23 and bottom wall 26 define an opening (not numbered) at the both ends of the casing 2 in the lengthwise direction. The end walls 21 and 22 extend from the top wall 23 at the both ends of the top wall 23 in the lengthwise direction, and the end walls 21 and 22 are arranged to be pivotable relative to the top wall 23 so that the opening defined by the top wall 23, the bottom wall 26 and the side walls 24, 25 can be closed. Preferably, the casing 2 is made of plastic material. Of course, the casing 2 may be made of other dielectric material to provide insulating protection.

As shown in FIG. 2, the top wall 23 and bottom wall 26 are of plate shape that are parallel with each other, wherein the ends of the top wall 26 in the lengthwise direction of the casing 2 are formed with weakened portions 231 of which the thickness is thinner than that of other portions of the top wall 26, and the bottom wall 26 is formed with a mounting structure 261 for installation of the electronic ballast assembly 1. In the present embodiment, as the electronic ballast assembly 1 is to be mounted to its mounting position by means of a screw structure, the mounting structure 261 is a U-shape notch disposed at the ends of the bottom wall 26 for mating with the screw structure.

Figure 4:
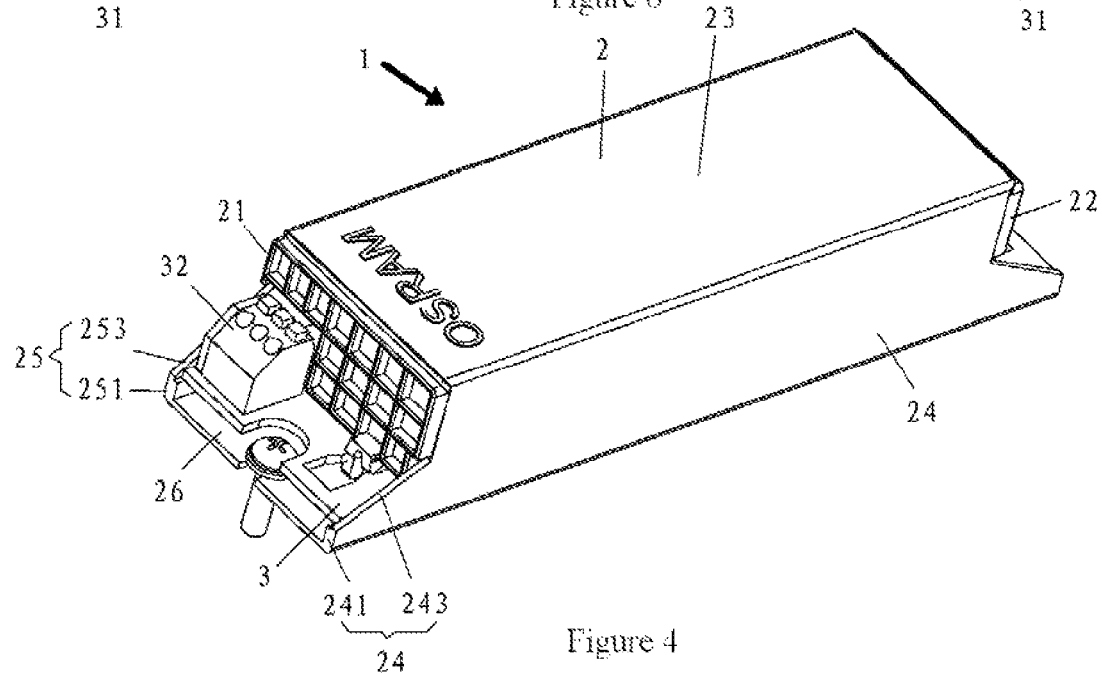
FIG. 4 is a perspective view of the electronic ballast assembly according to the invention, wherein the PCB assembly is assembled inside the casing for electronic ballast and the end wall is in a closed state, and a screw and washer for installing the assembled electronic ballast assembly are shown.

With reference to FIGS. 1 and 4, the side walls 24 and 25 are of plate shape that are parallel with each other and of symmetrical structure. The side walls 24 and 25 each comprises a thicker portion 241, 251 extending upwardly vertically from the bottom wall 26 and a thinner portion 243, 253 extending from the thicker portion 241, 251 to the top wall 23, wherein the thickness of the thinner portion 243, 253 is thinner than that of the thicker portion 241, 251 so as to form a step surface as a support portion on the inner surface of the side walls 24, 25. The distance between the inner surfaces of the thinner portions 243, 253 is no smaller than the width of the plate body 33 of the PCB assembly 3, while the distance between the inner surfaces of the thicker portions 241, 251 is smaller than the width of the plate body 33 of the PCB assembly 3, so as to support the PCB assembly 3 on the step surface formed on the inner surface of the side walls 24 and 25 and limit its position inside the casing 2. It is to be understood that although it is described in the embodiment that the support structure is a step surface used as the support portion, any suitable support form can be envisaged by those skilled in the art as long as it allows the PCB assembly to be inserted into the casing and to be supported. For example, a groove may be disposed on the side walls so that the PCB assembly can be inserted into the groove and slid inside the casing along the groove until the final position is reached. Alternatively, a projection rib can be disposed on the side walls to be extended inwardly form the side walls so as to support the PCB assembly etc.

As shown in FIGS. 2 and 5, the end walls 21 and 22 extend from the weakened portion 231 at the ends of the top wall and can be arranged to pivot relative to the top wall 23 about the weakened portion 231, so that the opening formed by the top wall 23, bottom wall 26 and side walls 24, 25 can be closed. In the present embodiment, the pivoting connection between the end walls 21, 22 and the top wall 23 is realized by forming a weakened portion 231 which is thinner than other portions of the top wall 23 at the connecting portion of the end walls 21, 22 and the top wall 23. However, those skilled in the art can understand that the pivoting connection can be realized by, for example, providing a discrete connecting portion between the end walls and the top wall. The end wall 21 has the same structure as the end wall 22. For ease of description, the end wall 21 is taken as an example for description. The end wall 21 comprises a main body 211 integrally extending from the top wall 23 (specifically, from the weakened portion 231 of the top wall 23), a second holding portion disposed on the main body 211 for mating with the first holding portion on the PCB assembly 3, and an opening portion 213 formed on the main body 211.

As shown in FIG. 2, the opening portion 213 is formed by cutting a portion of the material of the main body at a position corresponding to the terminal 32, so that the terminal 32 on the PCB assembly 3 is exposed upon the end wall 21 closes the opening formed by the top wall 23, the bottom wall 26, the side walls 24 and 25 after the PCB assembly 3 is assembled inside the casing 2, thus facilitating wire connecting and disconnecting of the electronic ballast assembly 1.

As described above, in the present embodiment, the holding portion on the PCB assembly 3 is a notch 31. Correspondingly, the second holding portions in the present embodiment are two tongue pieces 212 extending parallel from the ends of the main body 211, wherein the two tongue pieces 212 are spaced so that the distance between the outer surfaces of the two tongue pieces 212 in the maximum deformation state is no larger than the width of the second notch portion 312 of the notch 31 in the width direction of the PCB assembly 3, and is preferably no smaller than the width of the third notch portion 313 of the notch 31 in the width direction of the PCB assembly 3 in the non-deformation state. Further, the tongue piece 212 comprises a portion having a thickness that is substantially equal to the length of the third notch portion 313 in the lengthwise direction of PCB assembly 3. While it is described with details in the present embodiment that the first holding portion of the PCB assembly 3 is a notch while the second holding portion of the casing 2 is a tongue piece, those skilled in the art can understand that the holding portions may have other mating structures that can realize the positioning of PCB assembly inside the casing. For example, the first holding portion of the PCB assembly 3 can be a tongue piece while the second holding portion of the casing can be a notch, etc. Preferably, the end walls 21 and 22 are formed with integral reinforcing ribs so as to increase the thickness of the end walls 21 and 22, and to further improve the stress condition of the end walls 21, 22 during and after the snapping of the second holding portion into the notch.

With reference to FIGS. 1 and 4, an assembling method of the electronic ballast assembly 1 according to the invention will be described with details. During the assembling, the PCB assembly 3 is firstly slid into the casing 2 along the step surfaces of the end walls 24, 25 which serve as support portion, the support portion supports the PCB assembly 3 from below and thus limit the downward displace of the PCB assembly. In addition, the distance between the inner walls of the thinner portions 241,251 of the side walls 24, 25 is preferably arranged to be equal to the width of the plate body 33 of the PCB assembly 3. Therefore, the displace of the PCB assembly 3 in the width direction of the casing 2 can be restricted by the two inner walls after the PCB assembly 3 is mounted inside the casing 2. Then, the end walls 21, 22 are pivoted downwardly around the weakened portion 231 of the top wall 23. During the pivoting of end walls 21, 22, the two tongue pieces 212 firstly enter the fist notch portion 311 of the notch 31, then contact the transition portions between the first notch portion 311 and the second notch portion 312. With the reduction of the opening width between the beveling transition portions, the two spaced tongue pieces 212 are compressed relative to each other to elastically deform, so that the distance between the outer surfaces of the two tongue pieces 212 decreases and is thus able to pass the second notch portion 312 to enter the third notch portion 313. As the width of the third notch portion 313 is smaller than that of the second notch portion 312, after entering the third notch portion 313, the elastic deformation of the tongue pieces 212 slight restores. However, the two tongue pieces 212 can be right snapped in the third notch portion 313 or tightly snapped in the third notch portion 313 due to slight elastic deformation, because the distance between the outer surfaces of the two tongue pieces 212 is no larger that the width of the third notch portion 313. Thus, the displace of the PCB assembly 3 in the width direction of the casing 2 is restricted from above. As discussed above, the tongue pieces comprises a portion which has a thickness substantially equal to the length of the third notch portion 313 in the lengthwise direction of the PCB assembly 3, so that the tongue pieces can restrict displace of the PCB assembly 3 in the lengthwise direction of the casing 2 after the tongue pieces 212 are snapped into the third notch portion 313. Further, as shown in FIGS. 1 and 2, the length of the main body 211 is arranged such that when the end walls 21 and 22 pivot so as to snap the two tongue pieces 212 inside the notch 31, the end face 215 abut against the upper surface of the plate body 33 of the PCB assembly 3 to restrict upward displace of the PCB assembly 3 from above. Thus, the first holding portion engages the second holding portion to mount and fix the PCB assembly 3 inside the casing 2, thereby forming the electronic ballast assembly 1. In this case, terminal 32 exposes from the opening portion 213 on the end walls of the casing for facilitating direct wire connecting and disconnecting.

During the disassembling, the tongue pieces 212 are slightly pressed in such a manner that the distance therebetween. At the same time, the end walls 21, 22 are pivoted so that the holding portions 212 sequentially exit the third notch portion 313, the second notch portion 312 and the first notch portion 311, thereby releasing the snap fitting of the holding portion 212 on the PCB assembly 3. Then, the PCB assembly 3 are pulled so as to exit the casing 2, thus accomplishing the disassembly of PCB assembly 3 from the casing 2.

Figure 6:
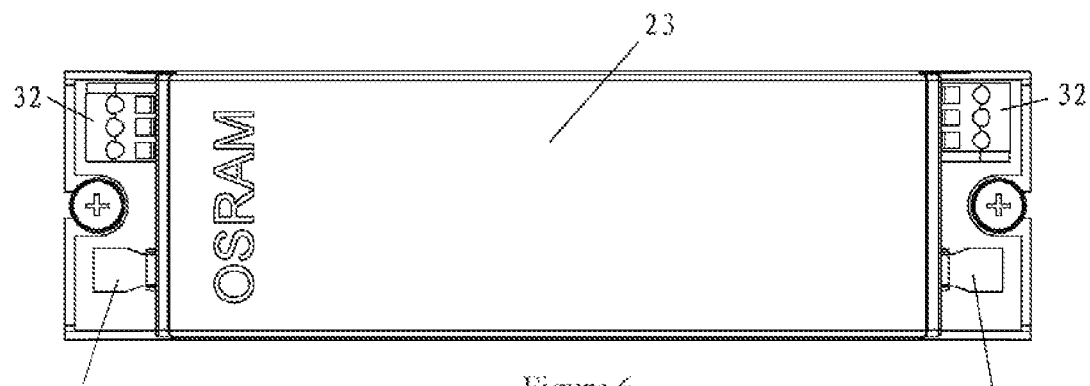
FIG. 6 is a top view of the electronic ballast assembly shown in FIG. 4.

In the illustrated embodiment, a U shape notch is provided at the middle portions of the ends of both the PCB assembly and the bottom wall of the casing, as shown in FIG. 1. Therefore, when the PCB assembly is assembled, a bolt can be screwed into an internal thread of an external member through the notch, so that the PCB assembly is fixed on the external member, as shown in FIGS. 4-6.

With the integral configuration of the casing for electronic ballast according to the invention, the PCB assembly can be mounted and positioned into the casing through the fitting between the holding portion of the end walls and the holding portion of the PCB assembly. Thus, the conventional step of filling material such as PVC into the inside of casing so as to hold the PCB assembly can be omitted, so that the assembly process of the mechanical structure of the casing of electronic ballast with electronic ballast can be simplified and manufacturing cost can be lowered. That is, the invention provides an integral casing for electronic ballast which is structurally simple, easy to assemble and low in cost.

While the preferred embodiment of the casing is described herein, it is understood by those with ordinary skills in the art that various variations and modifications can be made with the casing without departing the scope of the invention. For example, both the snapping structure between the PCB assembly and the casing and the shapes of the holding portion and the notch can be modified, as long as the holding portion and the notch fit with each other and can hold the PCB assembly in position. Further, the shape and size of the opening at the main body of the end wall can be changed according to the shape and size of the terminal.

The invention claimed is:

1. A casing for electronic ballast, in which a PCB assembly is received, the casing comprising:
   a top wall;
   a bottom wall opposite to the top wall;
   two opposite side walls extending integrally between the top wall and the bottom wall; and
   two opposite end walls extending integrally from the top wall,
   wherein the top wall, bottom wall, side walls and end walls are formed integrally, the top wall, bottom wall and side walls define openings at both ends of the casing in a lengthwise direction of the casing, the end walls are arranged to be pivotable relative to the top wall so as to close the openings formed by the top wall, bottom wall and side walls.

2. The casing according to claim 1, wherein both ends of the top wall in the lengthwise direction of the casing are formed with weakened portions having a thickness thinner than that of other portions of the top wall, so that the end walls can pivot relative to the top wall about the weakened portion.

3. The casing according to claim 1, wherein a support portion configured to support the PCB assembly is provided at the inner surfaces of the side walls.

4. The casing according to claim 3, wherein each side wall of the side walls comprises a thicker portion extending upwardly vertically from the bottom wall and a thinner portion extending from the thicker portion to the top wall, the thickness of the thinner portion is thinner than that of the thicker portion so as to form a step surface as the support portion of the inner surface of the side wall, and wherein the distance between the inner surfaces of the thinner portions is no smaller than the width of the PCB assembly, while the distance between the inner surfaces of the thicker portions is smaller than the width of the PCB assembly.

5. The casing according to claim 2, wherein each end wall comprises a main body integrally extending from the top wall, and wherein, after the PCB assembly is supported on the support portion of the side walls, the end face of the free end of the main body abuts against the upper surface of the PCB assembly upon the opening formed by the top wall, the bottom wall and side walls is closed by the end wall.

6. The casing according to claim 5, wherein the PCB assembly comprises a first holding portion disposed at each of opposite ends in the lengthwise direction, each end wall comprises a second holding portion extending from the main body of the end wall, and the first holding portion and the second holding portion are configured to engage with each other so as to position the PCB assembly inside the casing.

7. The casing according to claim 6, wherein the first holding portion of the PCB assembly is a notch composed of a first notch portion, a second notch portion and a third notch portion that are sequentially disposed in a direction away from the end of the PCB assembly in the lengthwise direction of the PCB assembly, the width of the first notch portion and the width of the third notch portion in the width direction of the PCB assembly are both larger than that of the second notch portion, and wherein the second holding portion of the end wall of the casing are two parallel tongue pieces extending from the main body of the end wall, the two tongue pieces are spaced so that the distance between the outer surfaces of the two tongue pieces in the maximum deformation state is no larger than the width of the second notch portion of the notch in the width direction of the PCB assembly, and is no smaller than the width of the third notch portion of the notch in the width direction of the PCB assembly in the non-deformation state, and the tongue piece is provided with a portion having a thickness that is substantially equal to the length of the third notch portion in the lengthwise direction of the PCB assembly.

8. The casing according to claim 5, wherein the PCB assembly is provided with a terminal, and the main body of the end wall of the casing is formed with an opening portion at a position corresponding to the terminal, so that the terminal of the PCB assembly is exposed upon the end wall closes the opening formed by the top wall, the bottom wall and the side walls.

9. An electronic ballast assembly, comprising a PCB assembly and a casing for receiving the PCB assembly, wherein the PCB assembly comprises a plate-shaped plate body and a first holding portion disposed at each of the opposite ends of the plate body; wherein the casing comprises a top wall; a bottom wall opposite to the top wall; two opposite side walls extending integrally between the top wall and the bottom wall; and two opposite end walls extending integrally from the top wall, wherein the top wall, bottom wall, side walls and end walls are formed integrally, the top wall, bottom wall and side walls define openings at both ends of the casing in the lengthwise direction of the casing, the end walls are configured to be pivotable relative to the top wall so as to close the opening formed by the top wall, bottom wall and side walls, a support portion configured to support the PCB assembly is provided at the inner surfaces of the side walls, each end wall comprises a main body extending from the top wall and a second holding portion disposed on the main body, and the first holding portion and the second holding portion are configured to engage with each other so as to position the PCB assembly inside the casing.

10. The electronic ballast assembly according to claim 9, wherein both ends of the top wall in the lengthwise direction of the casing are formed with weakened portions having a thickness thinner than that of other portions of the top wall, so that the end walls can pivot relative to the top wall about the weakened portions.

11. The electronic ballast assembly according to claim 9, wherein each side wall of the side walls comprises a thicker portion extending upwardly vertically from the bottom wall and a thinner portion extending from the thicker portion to the top wall, the thickness of the thinner portion is thinner than that of the thicker portion so as to form a step surface as the support portion of the inner surface of the side wall, and wherein the distance between the inner surfaces of the thinner portions is no smaller than the width of the PCB assembly, while the distance between the inner surfaces of the thicker portions is smaller than the width of the PCB assembly.

12. The electronic ballast assembly according to claim 9, wherein the first holding portion of the PCB assembly is a notch composed of a first notch portion, a second notch portion and a third notch portion that are sequentially disposed in a direction away from the end of the PCB assembly in the lengthwise direction of the PCB assembly, and the width of the first notch portion and the width of the third notch portion in the width direction of the PCB assembly are both larger than that of the second notch portion, and wherein the second holding portion of the end wall of the casing are two parallel tongue pieces extending from the main body of the end wall, wherein the two tongue pieces are spaced so that the distance between the outer surfaces of the two tongue pieces in the maximum deformation state is no larger than the width of the second notch portion of the notch in the width direction of the PCB assembly, and is no smaller than the width of the third notch portion of the notch in the width direction of the PCB assembly in the non-deformation state, and the tongue piece is provided with a portion having a thickness that is substantially equal to the length of the third notch portion in the lengthwise direction of the PCB assembly.

13. The electronic ballast assembly according to claim 9, wherein the PCB assembly is provided with a terminal at each of the opposite ends of the plate body thereof, and the main body of each end wall of the casing is formed with an opening portion at a position corresponding to the terminal, so that the terminal on the PCB assembly is exposed upon the end wall closes the opening formed by the top wall, the bottom wall and the side walls.

14. The electronic ballast assembly according to claim 9, wherein the main body of each end wall is configured such that, after the PCB assembly is supported on the support portion of the side walls, the end face of the free end of the main body abuts against the upper surface of the PCB assembly upon the opening formed by the top wall, the bottom wall and side walls is closed by the end wall.

15. A method of assembling an electronic ballast assembly, the electronic ballast assembly comprising: a PCB assembly and a casing for receiving the PCB assembly, wherein the PCB assembly comprises a plate-shaped plate body and a first holding portion disposed at each of the opposite ends of the plate body;

wherein the casing comprises a top wall; a bottom wall opposite to the top wall; two opposite side walls extending integrally between the top wall and the bottom wall; and two opposite end walls extending integrally from the top wall, wherein the top wall, bottom wall, side walls and end walls are formed integrally, the top wall, bottom wall and side walls define openings at both ends of the casing in the lengthwise direction of the casing, the end walls are configured to be pivotable relative to the top wall so as to close the opening formed by the top wall, bottom wall and side walls, a support portion configured to support the PCB assembly is provided at the inner surfaces of the side walls, each end wall comprises a main body extending from the top wall and a second holding portion disposed on the main body, and the first holding portion and the second holding portion are configured to engage with each other so as to position the PCB assembly inside the casing; the method comprising:

inserting the PCB assembly into the casing and supporting the PCB assembly on the supporting portion; and pivoting the end wall to engage the second holding portion of the end wall with the first holding portion of the PCB assembly so as to install and position the PCB assembly inside the casing.

* * * * *